United States Patent
Scocchetti

(10) Patent No.: US 9,766,285 B2
(45) Date of Patent: Sep. 19, 2017

(54) TEST BOARD WITH LOCAL THERMAL CONDITIONING ELEMENTS

(71) Applicant: Eles Semiconductor Equipment S.p.A., Todi (IT)

(72) Inventor: Fabrizio Scocchetti, Trevi (IT)

(73) Assignee: Eles Semiconductor Equipment S.p.A., Todi (PG) (IT)

( * ) Notice: Subject to any disclaimer, the term of this patent is extended or adjusted under 35 U.S.C. 154(b) by 224 days.

(21) Appl. No.: 14/411,428

(22) PCT Filed: Jun. 28, 2013

(86) PCT No.: PCT/EP2013/063685
§ 371 (c)(1),
(2) Date: Dec. 26, 2014

(87) PCT Pub. No.: WO2014/001528
PCT Pub. Date: Jan. 3, 2014

(65) Prior Publication Data
US 2015/0204942 A1 Jul. 23, 2015

(30) Foreign Application Priority Data

Jun. 29, 2012 (IT) ............................... MI2012A1157
Jun. 28, 2013 (IT) ............................... MI2013A1086

(51) Int. Cl.
*G01R 31/10* (2006.01)
*G01R 31/28* (2006.01)
*G01R 31/319* (2006.01)
*G01R 1/04* (2006.01)

(52) U.S. Cl.
CPC ....... *G01R 31/2863* (2013.01); *G01R 1/0458* (2013.01); *G01R 1/0466* (2013.01); *G01R 31/2874* (2013.01); *G01R 31/31905* (2013.01)

(58) Field of Classification Search
CPC ...... G01R 1/44; G01R 1/0458; G01R 1/0466; G01R 31/2855; G01R 31/2863;
(Continued)

(56) References Cited

U.S. PATENT DOCUMENTS 5,006,796 A * 4/1991 Burton .................... F25B 21/04
   165/61
6,078,185 A * 6/2000 Tanaka ................. G01R 1/0433
   324/750.03
(Continued)

*Primary Examiner* — Arleen M Vazquez
*Assistant Examiner* — Steven Yeninas
(74) *Attorney, Agent, or Firm* — Janeway Patent Law PLLC

(57) ABSTRACT

A solution for testing a set of one or more electronic device (105) is disclosed. A corresponding test board (100) comprises a support substrate (205), a set of one of more sockets (210) being mounted on the support substrate each one for housing an electronic device (105) to be tested with a main surface thereof facing the support substrate, for each socket a thermal conditioning element (235) for acting on the main surface of the electronic device, and for each socket biasing means (240) being switchable between an active condition, wherein the biasing means biases the thermal conditioning element in contact with the main surface of the electronic device, and a passive condition, wherein the biasing means maintains the thermal conditioning element separate from the main surface of the electronic device.

20 Claims, 6 Drawing Sheets

(58) Field of Classification Search
CPC .......... G01R 31/2872; G01R 31/2874; G01R 31/2875; G01R 31/2877; G01R 31/2891; G01R 31/31905; G01R 1/0433; G01R 31/2867; G01R 31/2889
USPC .......... 324/750.03, 750.04, 750.05, 750.06, 324/750.07, 750.09, 750.1, 750.11, 324/750.12, 750.13, 750.14, 756.01, 324/756.02
See application file for complete search history.

(56) References Cited

U.S. PATENT DOCUMENTS

| | | | |
|---|---|---|---|
| 6,137,298 A * | 10/2000 | Binns | G01R 31/2886 324/750.02 |
| 2004/0174181 A1 | 9/2004 | Stone | |
| 2004/0263193 A1 * | 12/2004 | Ryu | G01R 1/0458 324/750.09 |
| 2006/0186909 A1 | 8/2006 | Aube et al. | |
| 2008/0029763 A1 | 2/2008 | Kasukabe et al. | |
| 2008/0116922 A1 | 5/2008 | Blaney et al. | |
| 2008/0231309 A1 | 9/2008 | Takeshita | |
| 2008/0302783 A1 | 12/2008 | Wong et al. | |
| 2010/0019791 A1 * | 1/2010 | Yamashita | G01R 31/2891 324/757.01 |
| 2010/0201389 A1 | 8/2010 | Lupashku et al. | |
| 2010/0291793 A1 * | 11/2010 | Hsieh | H05K 7/1053 439/487 |
| 2011/0132000 A1 * | 6/2011 | Deane | F25B 21/04 62/3.3 |
| 2012/0252243 A1 * | 10/2012 | Chan | G01R 1/0458 439/197 |

* cited by examiner

TEST BOARD WITH LOCAL THERMAL CONDITIONING ELEMENTS

TECHNICAL FIELD

The present disclosure relates to the test field. More specifically, this disclosure relates to the test of electronic devices.

BACKGROUND ART

Electronic devices (typically comprising one or more integrated circuits) are generally subject to a test process in order to verify their correct operation; this is of the utmost importance in order to ensure a high quality of a production process of the electronic devices. The test may be aimed at identifying defects of the electronic devices (each one of them also know as Device Under Test, or DUT) that are either evident or potential, i.e., which might occur after a short period of use. During the test process, the electronic devices may be conditioned thermally (so as to ensure that they work at specific temperatures). A typical example is the burn-in test, wherein the electronic devices are tested under thermal stress conditions by making them working at temperatures being very high or very low (for example, from −50° C. to +150° C.); in this way, it is possible to simulate a long period of operation of the same electronic devices at room temperature (i.e., 25°-50° C.).

The test process may be carried out at wafer level or at package level. In the first case, the integrated circuits are tested directly when they are still comprised in a wafer of semiconductor material; in the second case, instead, the electronic devices are tested after their production is complete (i.e., the integrated circuits have been cut and enclosed into suitable packages). The test at package level reduces the risks of damaging the integrated circuits (for example, due to atmospheric contaminations or hits); moreover, this allows testing the electronic devices in their actual final form.

In the test of the electronic devices at package level, they are assembled onto test boards (for example, a Burn-In Board, or BIB, in case of the burn-in test) that are used for interfacing the electronic devices with a test apparatus. For this purpose, each test board is provided with one or more sockets. Each socket mechanically locks an electronic device and electrically connects its terminals to the test apparatus; at the same time, the socket allows removing the electronic device without any substantial damage at the end of the test process.

The test boards are placed into a global conditioning structure (for example, a oven), and hot or cold air is forced towards them in order to heat or cool, respectively, all the electronic devices mounted thereon. However, in this way the distribution of the temperature throughout the different electronic devices is not uniform.

Therefore, a conditioning element may be provided for each socket, so as to heat or cool the corresponding electronic device locally (in addition to the global action of the hot/cold air or in alternative thereto with the possible addition of a forced ventilation). The conditioning element may also be associated with a temperature sensor, which measures the local temperature of the electronic device so as to allow controlling the conditioning element accordingly.

Generally, the conditioning element is placed on top of the electronic device. However, in this way the electronic device is almost totally shielded from the hot/cold air or the forced ventilation, so that its terminals may reach a temperature that is significantly higher than the one of the package of the electronic device. The high temperature of the terminals (together with the high pressure applied thereto by the socket) may involve metal migration and micro-welding phenomena. These phenomena may deteriorate the socket (thereby adversely affecting its operation), up to damaging it (thereby requiring its replacement with a corresponding waste of time and money). Moreover, in this way the electronic device is to be inserted into and removal from the socket manually (with a deleterious effect on the performance of the test process).

Alternatively, the conditioning element may be arranged so as to act on the bottom of the electronic device.

For example, US-A-2008/0302783 (the entire disclosure of which is herein incorporated by reference) discloses a burn-in board embedding a heating element for each socket; the heating element is formed by a metal trace deposited in a layer of the burn-in board.

US-A-2010/0201389 (the entire disclosure of which is herein incorporated by reference) discloses an integrated unit comprising a heater board and a DUT board in thermal contact therewith; the heater board comprises global and local heaters that are printed thereon, and the DUT board comprises sockets each one in direct physical contact with a local heater.

US-A-2004/0174181 (the entire disclosure of which is herein incorporated by reference) discloses a temperature-controlled system comprising a thermal platform and a thermal plate located under and in thermal communication therewith; a wafer or packaged integrated circuit is mounted on the thermal platform, and a temperature-controlled fluid enters and propagates radially through a porous material of the thermal plate.

US-A-2008/0231309 (the entire disclosure of which is herein incorporated by reference) discloses a performance board comprising a substrate, sockets attached to the substrate and an adiathermic cover member attached to a rear surface of a region of the substrate on which the sockets are mounted.

However, the coupling of each electronic device with the corresponding conditioning element is not entirely satisfactory. Particularly, either the thermal and mechanical features of their assembly may be not completely effective.

SUMMARY

A simplified summary of the present disclosure is herein presented in order to provide a basic understanding thereof; however, the sole purpose of this summary is of introducing some concepts of the disclosure in a simplified form as a prelude to its following more detailed description, and it is not to be interpreted as an identification of its key elements nor as a delineation of its scope.

In general terms, the present disclosure is based on the idea of biasing a thermal conditioning element against a device to be tested.

Particularly, an aspect provides a test board comprising a set of one or more sockets, and for each socket a thermal conditioning element and biasing means switchable between an active condition and a passive condition.

A further aspect provides a socket for use in this test board.

A further aspect provides a corresponding test method.

More specifically, one or more aspects of the present disclosure are set out in the independent claims and advantageous features thereof are set out in the dependent claims, with the wording of all the claims that is herein incorporated verbatim by reference (with any advantageous feature provided with reference to a specific aspect that applies mutatis mutandis to every other aspect).

BRIEF DESCRIPTION OF THE DRAWINGS

The solution of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessary drawn to scale (with some details that may be exaggerated and/or simplified) and that, unless otherwise indicated, they are merely used to conceptually illustrate the structures and procedures described herein. Particularly.

DETAILED DESCRIPTION

Figure 1:
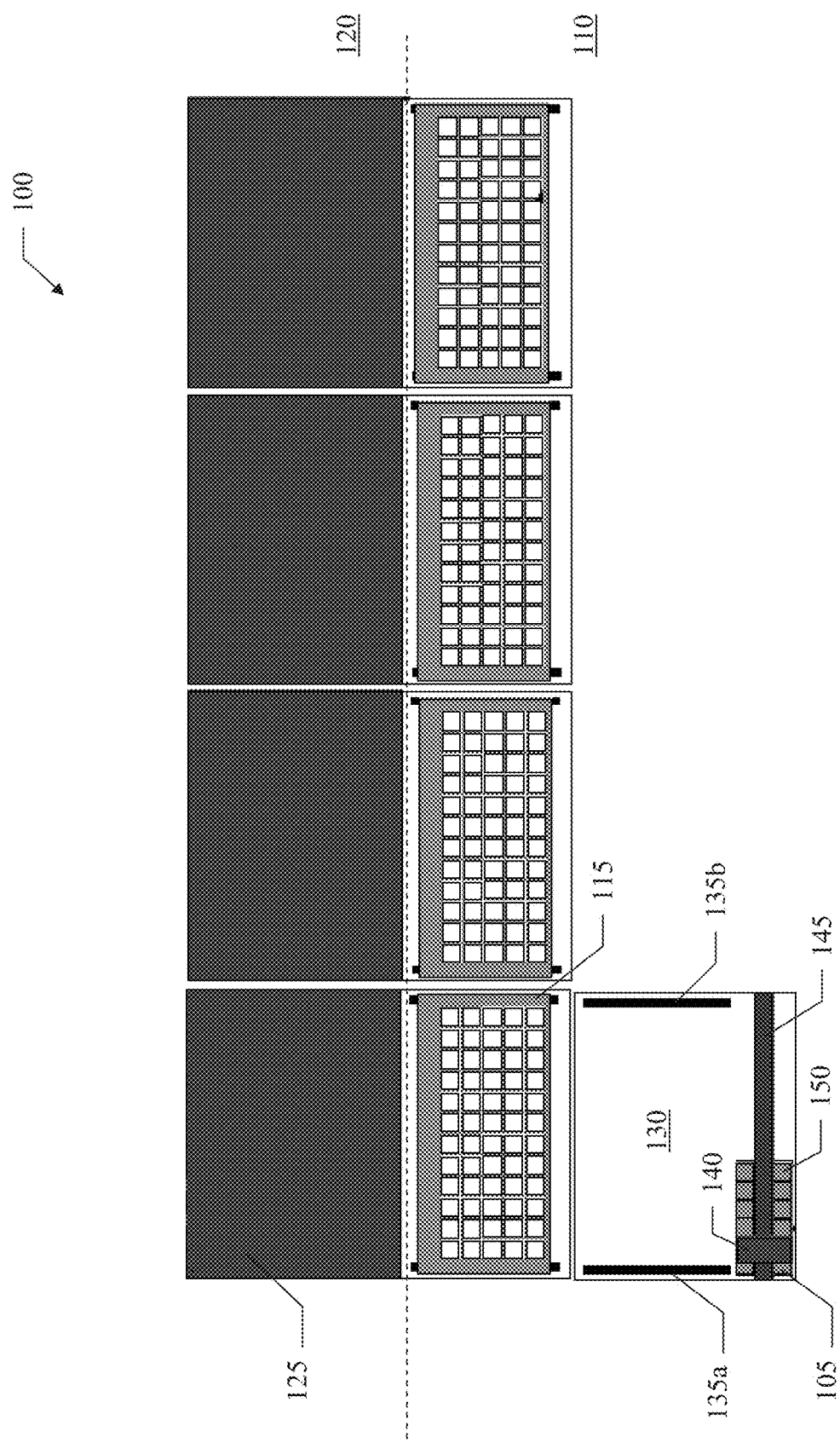
FIG. 1 shows a schematic representation of a test apparatus wherein the solution according to an embodiment of the present disclosure may be applied.

With reference in particular to the FIG. 1, a schematic representation is shown of a test apparatus 100 wherein the solution according to an embodiment of the present disclosure may be applied.

The test apparatus 100 is used for testing electronic devices (DUTs) 105 at package level; for example, the electronic devices 105 are subject to a burn-in test (wherein the electronic devices 105 are tested under thermal stress conditions).

The test apparatus 100 comprises a conditioning zone 110, wherein the electronic devices 105 are conditioned thermally during a test process thereof (i.e., an oven for the burn-in test). For this purpose, the electronic devices 105 are placed on test boards 115 (i.e., BIBs for the burn-in test). The test apparatus 100 also comprises a control zone 120, which is maintained at room temperature; the control zone 120 is thermally insulated from the conditioning zone 110, with the two zones 110 and 120 that communicate through slots provided with protecting seals (not shown in the figure). The control zone 120 houses a plurality of driving boards 125. Each test board 115 (once inserted in the conditioning zone 110) is electrically connected to a corresponding driving board 125. The driving board 125 comprises the circuits that are used for controlling the test process of the electronic devices 105 being placed on the test board 115; for example, the driving board 125 provides a power supply and stimulus signals to the electronic devices 105, and receives corresponding result signals therefrom.

A loader/unloader 130 is used to load the electronic devices 105 onto the test board 115 and vice-versa to unload them from it. The loader/unloader 130 may slide along the conditioning zone 110 (outside it). The loader/unloader 130 is provided with a pair of tracks 135a and 135b for supporting each test board 115; the loader/unloader 130 is also provided with a head 140 (for example, of the vacuum type), which may slide along a bar 145 that in turn may slide over the test board 115 housed in the loader/unloader 130.

The electronic devices 105 to be tested are provided in a tray 150 (which will be used for their final shipping). The tray 150 with these electronic devices 105 is transported towards the loader/unloader 130, which is placed in front of a (current) test board 115. This test board 115 is extracted from the conditioning zone 110 by disengaging it from the corresponding driving board 125 and then making it slide on the tracks 1235a, 135b. At this point, the loader/unloader 135 picks up the electronic devices 105 from the tray 150 and releases them onto the test board 115 in succession, until the test board 115 has been filled in. The test board 115 is then re-inserted into the conditioning zone 110 so as to return to its original position (coupled with the corresponding driving board 125). The loader/unloader 130 is moved in front of a next test board 115, so as to reiterate the same operations (until all the electronic devices 105 to be tested have been loaded).

At the end of the test process, the above-describe operations are repeated in reverse order. Particularly, a (current) test board 115 is extracted from the conditioning zone 110 and moved to the loader/unloader 135 (placed in front of it). The loader/unloader 135 picks up the electronic devices 105 from the test board 115 and releases them onto the tray 150 in succession, until the test board 115 has been emptied. The test board 115 is then re-inserted into the conditioning zone 110. The loader/unloader 130 is moved in front of a next test board 115, so as to reiterate the same operations (until all the electronic devices 105 being tested have been unloaded).

With reference now to the FIG. 2A-FIG. 2D, an exemplary scenario is shown of application of a test board according to an embodiment of the present disclosure.

Figure 2A:
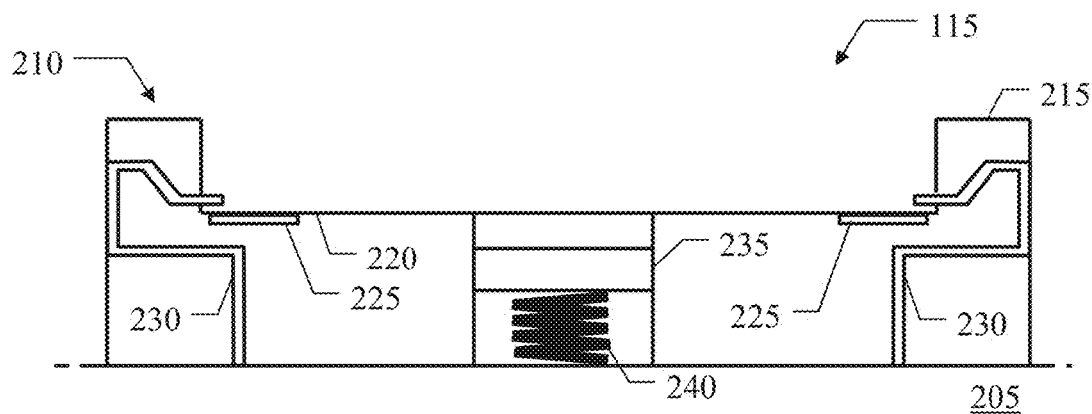
FIG. 2A-FIG. 2D show an exemplary scenario of application of a test board according to an embodiment of the present disclosure.

Starting from the FIG. 2A, a schematic representation in cross-section view is shown of a portion of the test board 115. The test board 115 comprises a circuited insulating support substrate, or simply substrate, 205 (for example, formed by a printed circuit board with one or more layers of electrically conductive tracks). One or more sockets 210, for example, arranged in a matrix of 2-10 rows and 5-20 columns (only one shown in figure), are mounted on an upper surface of the test board 115. Each socket 210 is used to house an electronic device (not shown in the figure), i.e., mechanically locking and electrically connecting it, at the same time allowing its removal without any substantial damage. For this purpose, the socket 210 comprises a base 215 of electrically insulating material (for example, plastic material). The base 215 defines a platform 220 for resting the electronic device. The base 215 exposes a frame of pads 225 of electrically conductive material (for example, metal like aluminum) around the platform 220, for electrical connecting the electronic device. A latch structure 230 (for example, based on clips) is used to lock the electronic device in a reversible way (i.e., without soldering or gluing); particularly, the latch structure 230 may be closed to lock the electronic device and it may be opened to release it. The socket 210 further comprises a thermal conditioning element for thermally conditioning the electronic device locally; for example, the thermal conditioning element is a heater 235 that may be implemented with a coil of electrically conductive material (for example, copper), which generates heat by Joule effect when a suitable voltage is applied thereto (for example, up to 100-200 V to generate 0.1-10 kJ). The heater 235 is arranged in the base 215 under the platform 220, so as to act on the electronic device on the same side of the substrate 205.

In the solution according to an embodiment of the present disclosure, a biasing structure 240 (for example, a spring) is provided for biasing the heater 235 against the electronic device. For example, the heater 235 may be housed in a channel of the base 215 under the platform 220 (extending transversally to the substrate 205); the heater 235 may slide along the channel under the action of the biasing structure 240.

At the beginning of a test process, as shown in the figure, the biasing structure 240 is in a passive condition, wherein it maintains the heater 235 separate from the platform 220 (for example, with the spring compressed by a mechanism that is also used to open the latch structure 230, not shown in the figure).

Figure 2B:
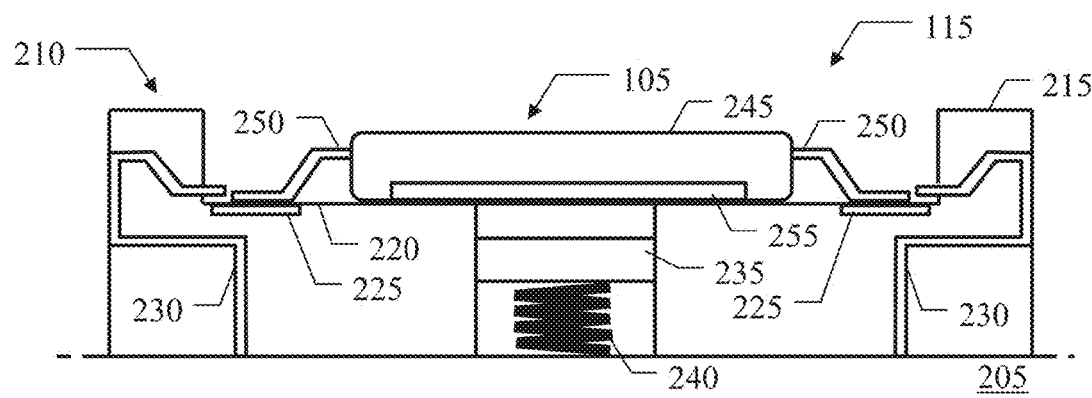

Moving to the FIG. 2B, the electronic devices to be tested are loaded onto the test board 115. For this purpose, each electronic device 105 (only one shown in the figure) is inserted into the corresponding socket 210. The electronic device 105 comprises an integrated circuit (or more) that it is made on a chip of semiconductor material (not shown in figure); the chip is enclosed in a case 245 of electrically insulating material (for example, plastic material). The chip is electrically connected to external terminals 250 of the electronic device 105, which implement its input/output (I/O) functions. In the example at issue, the electronic device 105 is of the Quad Flat Package (QFP) type, wherein the terminals 250 are gull-wing shaped and extend from each one of its four sides. The electronic device 105 may also comprise a heat-sink 255 on which the chip is mounted inside the case 245; the heat-sink 255 has a free portion that is exposed on a back surface of the case 245 (flush with the terminals 250), so as to facilitate the dissipation of heat produced by the integrated circuit during its operation. Once the latch structure 230 has been opened (for example, by pressing the corresponding mechanism from above), the electronic device 105 is inserted into the socket 210 by releasing it onto the base 215; therefore, the case 245 rests onto the platform 220 (with its back surface facing the substrate 205) and the terminals 250 rest onto the corresponding pads 225 (with a flat free end thereof). In this way, the heater 235 is separate from the electronic device 105, so that the latter is supported freely on the base 215; particularly, the heater 235 may be maintained at any distance from the electronic device 105 preventing any substantial interaction thereon (for example, at least 0.01 mm, preferably 0.1 mm, and still more preferable 1 mm, such as in the range 0.01-10 mm, preferably 0,1-5 mm, and still more preferably 1-3 mm).

Figure 2C:
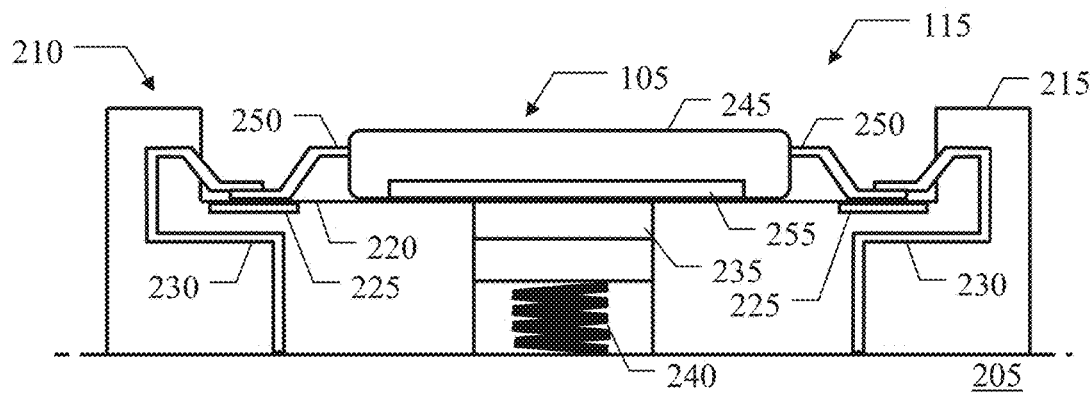

Moving to the FIG. 2C, the latch structure 230 is closed (for example, by removing the pressure on the corresponding mechanism), so as to press the terminals 250 against the corresponding pads 225; this locks the terminals 250 onto the pads 225 (and then the whole electronic device 105 onto the base 215), at the same time ensuring their good electrical connection.

Figure 2D:
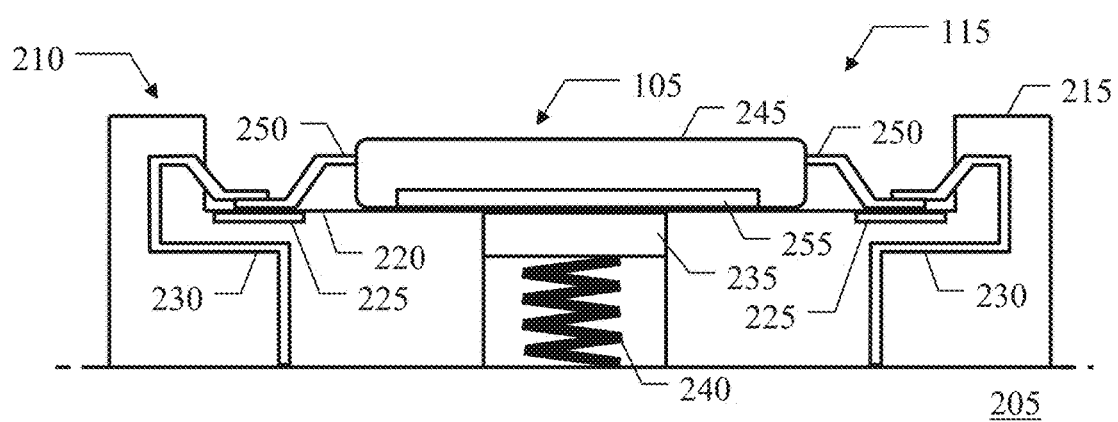

Moving to the FIG. 2D, the biasing structure 240 is switched to an active condition, wherein it biases the heater 235 in contact with the back surface of the electronic device 105, and particularly with its heat-sink 255 when available (for example, with the spring expanded); in this way, the heater 235 is urged against the electronic device 105, in opposition to the locking action of the latch structure 230.

At the end of the test process, the above-describe operations are repeated in reverse order for unloading the electronic devices being tested from the test board 115. For this purpose, each electronic device 105 is removed from the corresponding socket 210.

Particularly, returning to the FIG. 2C, the biasing structure 240 is switched to the passive condition (so that the heater 235 is separated from the back surface of the electronic device 105).

Returning to the FIG. 2B, the latch structure 230 is opened (so as to unlock the terminals 250 from the pads 225, and then the whole electronic device 105 from the base 215). At this point, the electronic device 105 (freely supported on the base 215) may be picked up from the socket 210.

The above-described solution improves the coupling of each electronic device 105 with the corresponding heater 235 during the test process; indeed, the action of the biasing structure 240 increases their effective assembly, with a beneficial effect on the corresponding thermal and mechanical features.

At the same time, the biasing structure 240 does not interfere with the insertion and the removal of the electronic device 105. This makes it possible to use automatic systems for loading/unloading the test board, with a corresponding increase of the performance of the test process.

Figure 3:
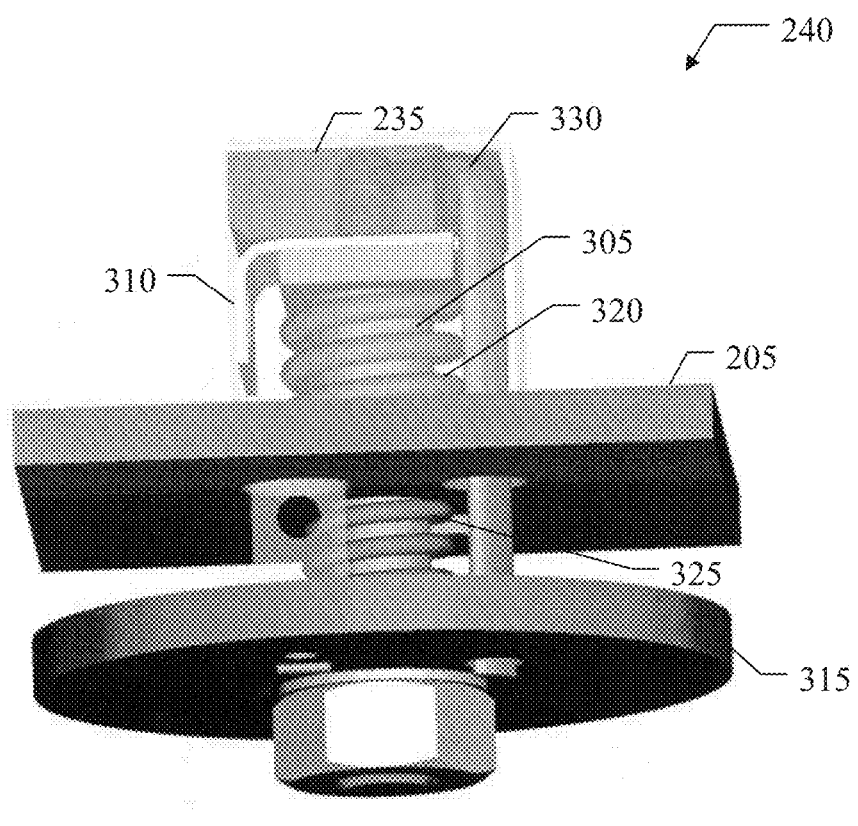
FIG. 3 shows an illustrative representation of a particular of a test board according to an embodiment of the present disclosure.

With reference now to the FIG. 3, an illustrative representation is shown of a particular of a test board according to an embodiment of the present disclosure.

In this case, each biasing structure 240 is implemented with one or more resilient elements for urging the heater 235 against the electronic device (not shown in the figure); an actuation structure is used for moving the heater 235 away from the electronic device in opposition to the resilient elements.

Particularly, in a specific implementation the biasing structure 240 comprises a stem 305 that may slide along a through hole crossing the substrate 205. An internal end of the stem 305 is coupled with the heater 235 (for example, welded thereto). A platen 310 with a U-like shape is also coupled with the internal end of the stem 305; the platen 310 extends towards the substrate 205 (with a length lower that the length of the channel of the heater 235 in the socket, not visible in the figure), so as to define an end-of-stroke of the stem 305 when a free end thereof abuts against the substrate 205. An external end of the stem 305 instead projects from a lower surface of the substrate 205 (opposite the surface wherein the sockets are mounted). The external end of the stem 305 is coupled with a plate 315 (for example, by means of a nut that is screwed onto a threaded portion of the external end crossing a corresponding through-hole of the plate 315). For example, the plate 315 may be a control board that is common for all the sockets; the control board 315 comprises the circuits that are used to sense a temperature of each heater 235 individually (for example, by means of a corresponding sensor embedded therein, not visible in the figure) and to control the heater 235 accordingly. An internal (coil) spring 320 is arranged around the stem 305, between the heater 235 and the substrate 205; an external (coil) spring 325 is likewise arranged around the stem 205, between the substrate 205 and the control board 315. A tube 330 may slide along another (smaller) through-hole crossing the substrate 205, and through a co-axial through-hole crossing the control board 315. An internal end of the tube 330 is coupled with the heater 235 (for example, welded thereto); the tube 330 houses a set of conductors (not shown in the figure) that are used to exchange electrical signals with the heater 235, for example, for receiving the sensed temperature and for controlling it (which the conductors that exit the tube 330 at an external end thereof for their connection to the circuits of the control board 315).

The stem 305 has a length sufficient for the heater 235 to reach the electronic device before an end-of-stroke position of the control board 315 (wherein the external spring 325 would be completely compressed). Moreover, the internal spring 320 has a length higher than the one of the channel of the heater 235. The internal spring 320 is stiffer than the external spring 325; for example, the spring constant of the internal spring 320 is equal to 1,2-3 times, preferably 1,5-2,5 times, and still more preferably 1,8-2,2 times, such as 2 times, the spring constant of the external spring 325. Therefore, in a rest condition of the springs 320, 325 (i.e., without the application of any external forces thereto), the internal spring 320 expands and the external spring 325 compresses. Particularly, the springs 320 and 325 are dimensioned so that in the rest condition the external spring 325 does not compress completely (i.e., with room for a further compression thereof), and the internal spring 320 would expand (if left free without the electronic device) to a length higher than the one of the channel of the heater 235. As a result, the internal spring 320 is compressed (between the heater 235 and the substrate 205) when the electronic device is inserted in the socket (and the heater 235 abuts against it); in this way, the internal spring 320 exerts a corresponding reaction force (for example, of the order of 0,01-0,05 N), which is applied by the heater 235 to the electronic device; at the same time, the external spring 325 still behaves elastically, thereby reducing any stress on the control board 315. In this situation, the biasing structure 240 is in the active condition.

The biasing structure 240 is switched to the passive condition by moving the control board 315 away from the substrate 205 by means of a corresponding driving structure (not shown in the figure), so as to compress the internal spring 320 (at most up to when the platen 310 reaches the substrate 205).

The above-described structure is very simple and cheap. Particularly, in this way the biasing structure 240 is normally in the active condition (so that no dedicated action is required during the test process). Moreover, the use of the two springs 320, 325 smoothes the switching from the passive condition to the active condition automatically.

Figure 4A:
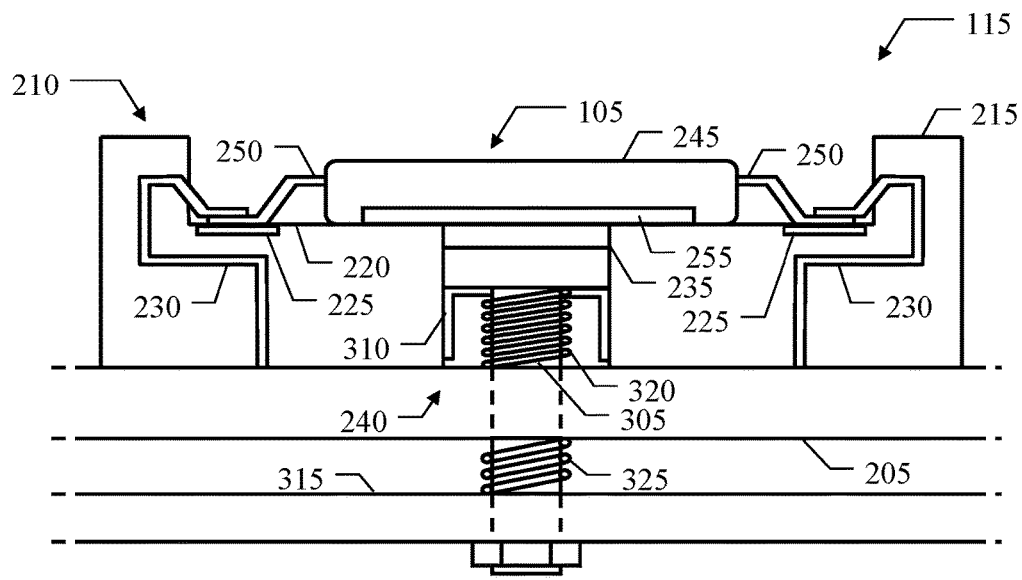
FIG. 4A-FIG. 4B show an exemplary scenario of application of a test board according to a further embodiment of the present disclosure.
Figure 4B:
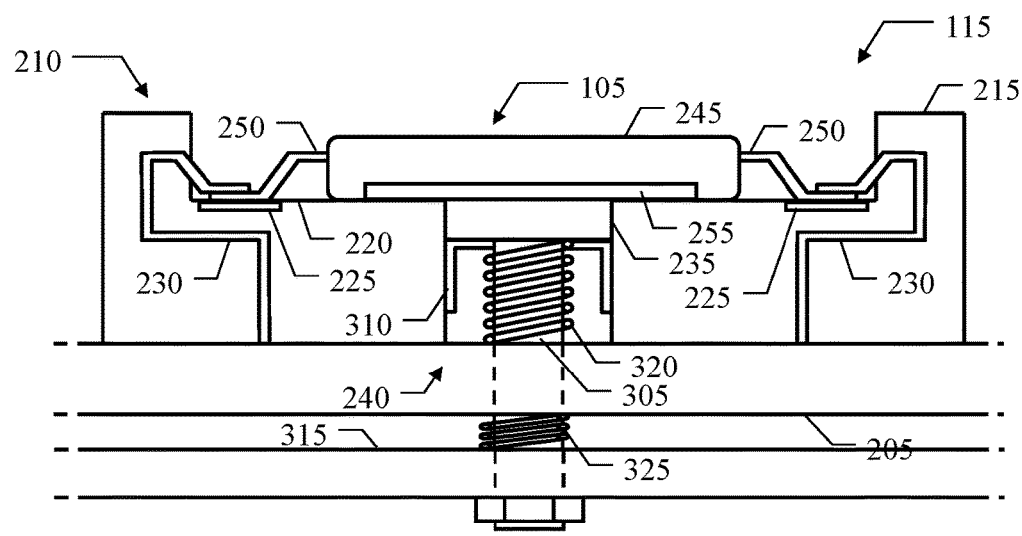

With reference now to the FIG. 4A-FIG. 4B, an exemplary application is shown of a test board according to a further embodiment of the present disclosure.

Starting from the FIG. 4A, in this case the biasing structure 240 is based on the shape-memory material technology.

Particularly, in a specific implementation one of the springs 320, 325—for example, the internal spring 320—is made of a two-way shape-memory material (for example, an alloy of copper-aluminum-nickel); the other one of the springs 320, 325 may instead be made of a conventional elastic material (for example, steel).

In the passive condition of the biasing structure 240, the internal spring 320 is cooled below a low completion temperature (for example, at room temperature, i.e., 25-50° C.). Therefore, the internal spring 320 takes a predefined low-temperature shape. Particularly, the internal spring 320 has been trained so that its low-temperature shape has a length shorter than the one of the channel of the heater 235 (so that it is maintained separate from the electronic device 105); as a consequence, the external spring 325 (less stiff) expands, thereby moving the control board 315 away from the substrate 205.

During the test process, as shown in the FIG. 4B, the internal spring 320 heats (typically, to a temperature of the order of 180-200° C.). As soon as the internal spring 320 exceeds a transition temperature (for example, of the order of 50-100° C., preferably 60-90° C. and still more preferably 70-80° C.), it starts transitioning towards a (different) pre-defined high-temperature shape. The transition completes when the internal spring 320 is heated above a high completion temperature (for example, 120-140° C.). Therefore, the internal spring 320 takes its high-temperature shape; particularly, the internal spring 320 has been trained so that the high-temperature shape has a length longer than the one of the channel of the heater 235, so that it is elastically compressed between the substrate 205 and the heater 235 (abutting against the electronic device 105); as a consequence, the external spring 325 (less stiff) is compressed, thereby moving the control board 315 towards the substrate 205. In this way, the biasing structure 240 is switched to the active condition.

At the end of the test process, the internal spring 320 cools (returning to the room temperature)—either naturally or with the help of a forced refrigeration. As soon as the internal spring 320 falls below the transition temperature, it starts transitioning back towards the low-temperature shape, with the transition that completes when the internal spring 320 is cooled below the low completion temperature (so as so return to the condition of the FIG. 4A).

In this way, the switching of the biasing structure 240 between the active condition and the passive condition is achieved automatically during the use of the test board 115, without requiring any specific action. Moreover, this allows controlling the force applied to the electronic device by the heater in a very accurate way.

Figure 5A:
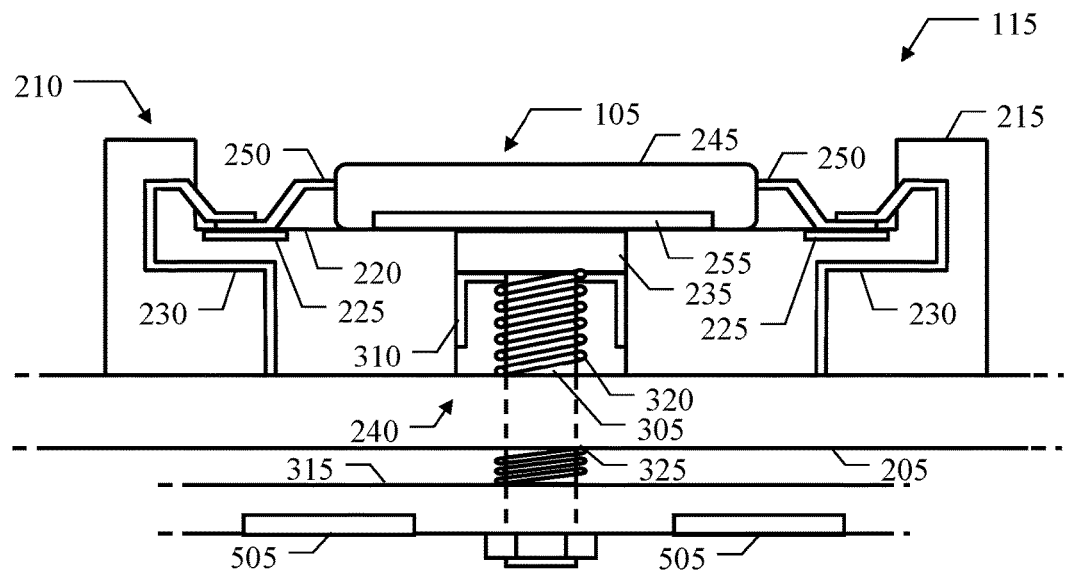
FIG. 5A-FIG. 5B show an exemplary scenario of application of a test board according to a still further embodiment of the present disclosure.
Figure 5B:
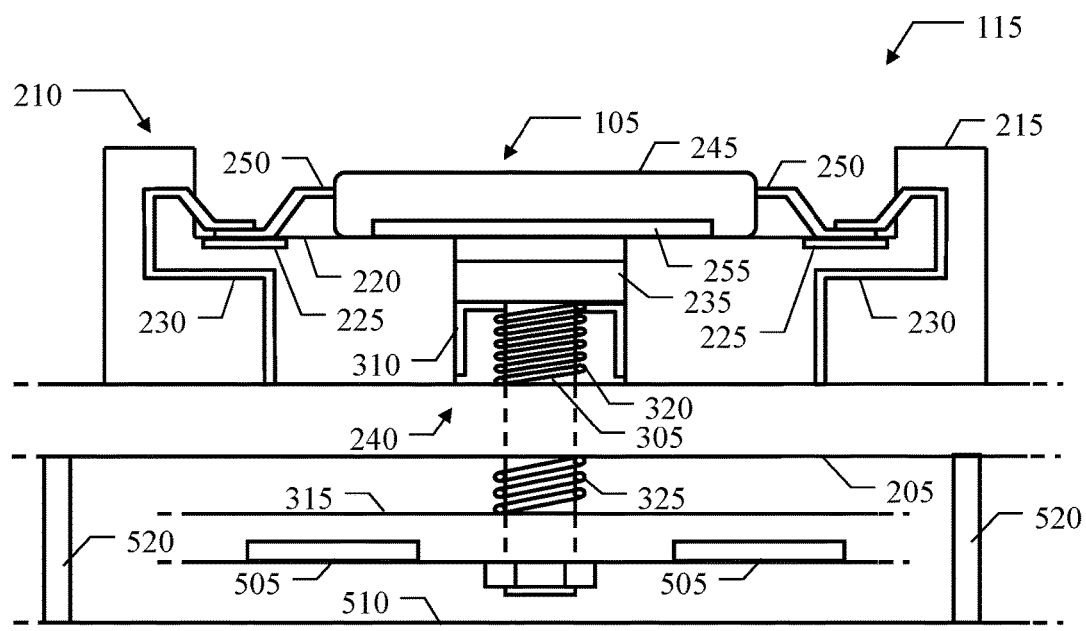

With reference now to the FIG. 5A-FIG. 5B, an exemplary application is shown of a test board according to a still further embodiment of the present disclosure.

Starting from the FIG. 5A, in this case the above-mentioned driving structure (for switching the biasing structure 240 from the passive condition to the active condition) is based on magnetic interaction.

Particularly, in a specific implementation one or more permanent magnets 505 (for example, discs of magnetite) are coupled with the heater 235, for example, the permanent magnets 505 (two of them shown in the figure) are embedded in the control board 315. Each permanent magnet 505 is arranged so that a corresponding magnetic field has a magnetic moment that is transversal to the substrate 205 (for example, with its north pole on an upper surface thereof facing the substrate 205 and its south pole on a lower surface thereof facing away from the substrate 205).

In the active condition of the biasing structure 240, no magnetic force is applied to the permanent magnets 505. Therefore, the internal spring 320 expands and compresses the external spring 325 (thereby moving the control board 315 towards the substrate 205); in this situation, the internal spring 320 forces the heater 235 against the electronic device 105, being partially compressed between the substrate 205 and the heater 235 abutting against the electronic device 105).

Moving to the FIG.5B, in order to switch the biasing structure 240 to the passive condition, the test board 115 is placed onto a table 510. The table 510 comprises a ferro-magnetic plate 515 (for example, made of steel); a spacer structure 520 (for example, a plurality of pegs around the control board 315) projects upwards from the ferromagnetic plate 510, so as to maintain the substrate 205 spaced apart from it (to an extent allowing the whole stroke of the stem 305). In this condition, the ferromagnetic plate 515 is placed inside the magnetic field generated by the permanent magnets 505. Therefore, the ferromagnetic plate 515 magnetizes (with the north pole on its upper surface and the south pole on its lower surface in the example at issue); consequently, a magnetic attractive force is generated between the ferromagnetic plate 515 and the permanent magnets 505. Such attractive force depends on the strength of the magnetic field generated by the permanent magnets 505 (in turn depending on their material, size and shape), and on the distance between the permanent magnets 505 and the ferromagnetic plate 515 (and on the interposed materials); for example, the attractive force may have a value of the order of 0,05-0,1 N. In any case, the attractive force is enough to compress the internal spring 320 (at most up to when the platen 310 reaches the substrate 205), so as to separate the heater 235 from the electronic device 105.

The biasing structure 240 is switched back to the passive condition by simply spacing apart the test board 115 from the table 510 (i.e., by raising it). In this way, the ferromagnetic plate 515 exits the magnetic field generated by the permanent magnets 505. As a result, the corresponding attractive force between the ferromagnetic plate 515 and the permanent magnets 505 ceases so as to return to the condition of the FIG. 5A.

This structure is very simple and cheap; particularly, it does not require any specific mechanism for switching the biasing structure from the active condition to the passive condition.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variables involved), and the term a/an should be intended as one or more items (unless expressly indicated otherwise).

For example, an embodiment provides a test board. The test board comprises a support substrate. The test board comprises a set of one of more sockets (mounted on the support substrate) each one for housing an electronic device to be tested with a main surface thereof facing the support substrate. For each socket, the test board comprises a thermal conditioning element for acting on the main surface of the electronic device. For each socket, the test board comprises biasing means that may be switched between an active condition (wherein the biasing means biases the thermal conditioning element in contact with the main surface of the electronic device) and a passive condition (wherein the biasing means maintains the thermal conditioning element separate from the main surface of the electronic device).

However, the test board may be of any type, and it may be provided with sockets of any type, at any position and in any number (for example, with any latching structure, such as based on a cover acting on the case of the electronic device). In any case, the test board may be used in any test process in the widest meaning of the term (even not of the thermal type). For example, it is possible to use the test board in reliability tests during a preliminary phase of development of the electronic devices (in order to verify small series of electronic devices, down to those being housed on a single test board); other examples are functional tests or parametric tests (that may also be executed at the same time of the burn-in test). Moreover, it is possible to test the electronic devices under any electrical and/or thermal stress conditions (for example, forcing specific thermal cycles); alternatively, it is possible to simply maintain the temperature of the electronic devices under test at a predetermined value (for example, at room temperature). Moreover, the test process may be applied to any type of electronic devices (for example, of optical type or based on discreet components); the electronic devices may be provided in any packages (for example, of the Ball-Grid-Array type), even without any heat-sink, and with any terminals (for example, of J-shaped type). The thermal conditioning element may be of any type, for example, with two or more components, even not based on the Joule effect (for example, exploiting a conditioning fluid); moreover, the thermal conditioning element may be used either to heat or to cool the electronic device to any temperature. The biasing means may be implemented in any way (see below); moreover, the biasing means may cause the thermal condition element to apply any non-zero pressure against the electronic device in the active condition and it may maintain the thermal condition element at any not-zero distance from the electronic device in the passive condition.

In an embodiment, for each socket the biasing means comprises resilient means for urging the thermal conditioning element against the main surface of the electronic device in the active condition.

However, the resilient means may be implemented in any way (see below); in any case, the possibility of having an active structure for urging the thermal conditioning element against the main surface of the electronic device is not excluded.

In an embodiment, the test board further comprises actuation means for moving the thermal conditioning element of each socket away from the main surface of the electronic device in opposition to the resilient means.

However, the actuation means may be implemented in any way (see below); in any case, the actuation means may also be omitted at all (for example, when their function is performed by the resilient means directly, for example, based on the shape memory material technology).

In an embodiment, for each socket the actuation means comprises a slidable element, which may slide across the support substrate; the slidable element has an internal end (coupled with the thermal conditioning element within the socket) and an external end (projecting from a surface of the support substrate opposite the socket). The resilient means comprises an internal spring element (which has a first stiffness and it is coupled between the thermal conditioning element and the support substrate) and an external spring element (which has a second stiffness, lower than the first stiffness, and it is coupled between the support substrate and the external end of the slidable element). The actuation means does not act on the internal spring element and the external spring element in the active condition; the actuation means compresses the internal spring element in the passive condition.

However, the actuation means may have any type of slidable elements, at any position and in any number (for example, one, two or more elements only slidable within the socket); in any case, the actuation means may be implemented in any way (for example, with a mechanism that is also used to open the latch structure of the socket and that is actuated by applying a pressure from above). Likewise, the resilient means may have spring elements at any position and in any number (for example, without the external spring element); moreover, each spring element may be of any type (for example, a rubber band).

In an embodiment, the actuation means comprises magnetic means that is coupled with the thermal conditioning element of each socket for moving the thermal conditioning element away from the main surface of the electronic device by magnetic interaction with a magnetic driving structure.

However, the magnetic means may be implemented in any way, for use with any magnetic driving structure (see below). In any case, the magnetic interaction between the magnetic means and the magnetic driving structure may be of any type (for example, generating a repulsive force). More generally, the actuation means may be of any other type (for example, based on a simple mechanism for pulling or pushing the thermal conditioning elements).

In an embodiment, the magnetic interaction means comprises at least one permanent magnet.

However, the permanent magnets may be of any type, shape and size (for example, plates of cobalt, nickel, ceramic magnets, sintered magnets or printed magnets); moreover, the permanent magnets may be at any position (see below) and in any number (i.e., one or more for each socket or in common for all of them or groups thereof). In any case, the magnetic means may be implemented with electromagnets or it may be made of ferromagnetic material (with the magnetic driving structure made of magnetic material).

In an embodiment, the test board further comprises a control board for controlling the thermal conditioning element of each socket, which is coupled with the external end of the corresponding slidable element; the magnetic interaction means is integral with the control board.

However, the control board may be coupled with the external end of the slidable element of each socket in any way (for example, by clips or any other fastening structure); likewise, the magnetic interaction means may be made integral with the control board in any way (for example, fastened thereto by welding or gluing). In any case, the magnetic interaction means may be arranged elsewhere (for example, directly fastened to each thermal conditioning element).

In an embodiment, for each socket the resilient means comprises at least one shape memory element, which has a first shape at a test temperature defining the active condition and a second shape at an assembly temperature defining the passive condition.

However, the shape memory element may be of any type (for example, based on the one-way memory effect) and made of any material (for example, Nichel-Tinanium); moreover, the shape memory elements may be at any position and in any number (for example, with only the external spring element that is made of a shape memory material whereas the internal spring element is made of a standard material, or both of them that are made of shape memory materials, even different to each other).

In an embodiment, the assembly temperature is lower than the test temperature.

However, the different shapes may be taken at any temperatures (even with the assembly temperature higher than the test temperature).

In an embodiment, a transition temperature of each shape memory element between the first shape and the second shape is comprised between 50-100° C.

However, the transition temperature may have any other value (even below 0° C.).

A further embodiment provides a socket for use in the above-mentioned test board; the socket comprises said thermal conditioning element and said biasing means.

However, the socket may be of any type (see above). It should be noted that the socket described above is suitable to be put on the market even as a stand-alone product, in order to be used with existing test boards.

Generally, similar considerations apply if the test board and the socket each one has a different structure or comprises equivalent components (for example, of different materials), or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

A further embodiment provides a method for testing a set of one or more electronic devices. The method comprises the following steps. Each electronic device is inserted into a corresponding socket (being mounted on a support substrate of a test board) with a main surface thereof facing the support substrate, while biasing means of the socket is in a passive condition wherein the biasing means maintains a thermal conditioning element of the socket separate from the main surface of the electronic device. The biasing means of each socket is switched to an active condition, wherein the biasing means biases the thermal conditioning element in contact with the main surface of the electronic device. The electronic devices are tested. The biasing means of each socket is switched to the passive condition. Each electronic device is removed from the corresponding socket.

However, the electronic devices may be inserted into the socket and removed therefrom in any way (even manually), the biasing means may be switched between the passive condition and the active condition in any way, and the electronic devices may be tested in any way (see above).

In an embodiment, the step of switching the biasing means of each socket to an active condition comprises causing resilient means of each socket to urge the thermal conditioning element against the main surface of the electronic device.

However, the thermal conditioning element may be urged against the main surface in any way (see above).

In an embodiment, the step of switching the biasing means of each socket to the passive condition comprises moving the thermal conditioning element of each socket away from the main surface of the electronic device in opposition to the resilient means.

However, the thermal conditioning element of each socket may be moved away from the main surface of the electronic device in any way (see above).

In an embodiment, the step of switching the biasing means of each socket to an active condition comprises not acting on an internal spring element and an external spring element of the resilient means. The internal spring element has a first stiffness and it is coupled between the thermal conditioning element and the support substrate; the external spring element has a second stiffness (lower than the first stiffness) and it is coupled between the support substrate and an external end of a slidable element (with the slidable element that is slidable across the support substrate and it has an internal end coupled with the thermal conditioning element within the socket and the external end projecting from a surface of the support substrate opposite the socket). The step of switching the biasing means of each socket to the passive condition comprises compressing the internal spring element.

However, both the steps of switching may be implemented in any way (see above).

In an embodiment, the step of switching the biasing means of each socket to the passive condition comprises moving magnetic means (coupled with the thermal conditioning element of each socket) close to a magnetic driving structure so as to cause the magnetic means to move the thermal conditioning element away from the main surface of the electronic device by magnetic interaction with the magnetic driving structure. The step of switching the biasing means of each socket to an active condition comprises moving the magnetic means away from the magnetic driving structure thereby reducing the corresponding magnetic interaction.

However, both the steps of switching may be implemented in any way (see above), for example, with the magnetic means that is placed below the magnetic driving structure.

In an embodiment, the step of switching the biasing means of each socket to the passive condition comprises moving at least one permanent magnet of the magnetic means close to a ferromagnetic structure of the magnetic driving structure; the step of switching the biasing means of each socket to an active condition comprises moving said at least one permanent magnet away from the ferromagnetic structure.

However, both the steps of switching may be implemented in any way (see above); moreover, the ferromagnetic structure may be of any type (for example, one or more actuation heads) and it may be made of any material (for example, iron, cobalt, nickel, transition metals).

In an embodiment, the step of switching the biasing means of each socket to an active condition comprises testing the electronic devices at a test temperature, thereby causing at least one shape memory element of the resilient means of each socket to take a first shape; the step of switching the biasing means of each socket to the passive condition comprises inserting each electronic device into the corresponding socket and removing each electronic device from the corresponding socket at an assembly temperature, thereby causing said at least one shape memory element to take a second shape.

However, both the steps of switching may be implemented in any way (see above), for example, by heating or cooling the test board either before or during the insertion and the removal of the electronic devices.

In an embodiment, the step of switching the biasing means of each socket to an active condition comprises heating said at least one shape memory element to the test temperature; the step of switching the biasing means of each socket to the passive condition comprises cooling said at least one shape memory element to the assembly temperature lower than the test temperature.

However, both the steps of switching may be implemented in any way (see above).

In an embodiment, the step of switching the biasing means of each socket to an active condition and the step of switching the biasing means of each socket to the passive condition comprise causing said at least one shape memory element to cross a transition temperature of each shape memory element between the first shape and the second shape comprised between 50-100° C.

However, both the steps of switching may be implemented in any way (see above).

Generally, similar considerations apply if the same solution is implemented with an equivalent method (by using similar steps with the same functions of more steps or portions thereof, removing some steps being non-essential, or adding further optional steps); moreover, the steps may be performed in a different order, concurrently or in an interleaved way (at least in part).

The invention claimed is:

1. A test board comprising:
   a support substrate;
   a set of one of more sockets being mounted on the support substrate each one for housing an electronic device to be tested with a main surface thereof facing the support substrate, each socket including:
      a platform for resting the electronic device to be tested, and
      a thermal conditioning element for acting on the main surface of the electronic device, the thermal conditioning element located in the socket such that the platform lies between the thermal conditioning element and the electronic device to be tested; and
      a biasing means being switchable between an active condition, wherein the biasing means biases the thermal conditioning element in contact with the main surface of the electronic device, and a passive condition, wherein the biasing means maintains the thermal conditioning element separate from the main surface of the electronic device.

2. The test board according to claim 1, wherein for each socket the biasing means comprises resilient means for urging the thermal conditioning element against the main surface of the electronic device in the active condition.

3. The test board according to claim 2, further comprising actuation means for moving the thermal conditioning element of each socket away from the main surface of the electronic device in opposition to the resilient means.

4. The test board according to claim 3, wherein for each socket the actuation means comprises a slidable element being slidable across the support substrate, the slidable element having an internal end coupled with the thermal conditioning element within the socket and an external end projecting from a surface of the support substrate opposite the socket, and wherein the resilient means comprises an internal spring element having a first stiffness being coupled between the thermal conditioning element and the support substrate, and an external spring element having a second stiffness lower than the first stiffness being coupled between the support substrate and the external end of the slidable element, the actuation means not acting on the internal spring element and the external spring element in the active condition and compressing the internal spring element in the passive condition.

5. The test board according to claim 4, wherein the actuation means comprises magnetic means coupled with the thermal conditioning element each socket for moving the thermal conditioning element away from the main surface of the electronic device by magnetic interaction with a magnetic driving structure.

6. The test board according to claim 5, wherein the magnetic means comprises at least one permanent magnet.

7. The test board according to claim 5, further comprising a control board for controlling the thermal conditioning element of each socket being coupled with the external end of the corresponding slidable element, the magnetic means being integral with the control board.

8. The test board according to claim 2, wherein for each socket the resilient means comprises one or more springs at least one of the springs being a shape memory element having a first shape at a test temperature defining the active condition and a second shape at an assembly temperature defining the passive condition, the assembly temperature being different from the test temperature.

9. The test board according to claim 8, wherein the assembly temperature is lower than the test temperature.

10. The test board according to claim 8, wherein a transition temperature of each shape memory element between the first shape and the second shape is comprised between 50-100° C.

11. A socket for use in a test board, the socket comprising:
a platform for resting an electronic device to be tested:
a thermal conditioning element for acting on the electronic device, the thermal conditioning element located in the socket such that the platform lies between the thermal conditioning element and the electronic device to be tested; and
a biasing means being switchable between an active condition, wherein the biasing means biases the thermal conditioning element in contact with the main surface of the electronic device, and a passive condition, wherein the biasing means maintains the thermal conditioning element separate from the main surface of the electronic device.

12. A method for testing a set of one or more electronic devices, the method comprising:
inserting each electronic device into a corresponding socket being mounted on a support substrate of a test board with a main surface thereof facing the support substrate, each socket including:
a platform for resting the electronic device,
a thermal conditioning element for acting on the main surface of the electronic device, the thermal conditioning element located in the socket such that the platform lies between the thermal conditioning element and the electronic device, and
a biasing means for positioning the thermal conditioning element relative to a corresponding electronic device held by the socket,
wherein, inserting each electronic device occurs while the biasing means of the socket is in a passive condition wherein the biasing means maintains a thermal conditioning element of the socket separate from the main surface of the electronic device;
switching the biasing means of each socket to an active condition, wherein the biasing means biases the thermal conditioning element in contact with the main surface of the electronic device;
testing the electronic devices;
switching the biasing means of each socket to the passive condition; and
removing each electronic device from the corresponding socket.

13. The method according to claim 12, wherein said switching the biasing means of each socket to the active condition comprises:
causing resilient means of each socket to urge the thermal conditioning element against the main surface of the electronic device.

14. The method according to claim 13, wherein said switching the biasing means of each socket to the passive condition comprises:
moving the thermal conditioning element of each socket away from the main surface of the electronic device in opposition to the resilient means.

15. The method according to claim 14, wherein:
said switching the biasing means of each socket to the active condition comprises not acting on an internal spring element and an external spring element of the resilient means, the internal spring element having a first stiffness and being coupled between the thermal conditioning element and the support substrate, and the external spring element having a second stiffness lower than the first stiffness and being coupled between the support substrate and an external end of a slidable element, the slidable element being slidable across the support substrate and having an internal end coupled with the thermal conditioning element within the socket and the external end projecting from a surface of the support substrate opposite the socket, and
said switching the biasing means of each socket to the passive condition comprises compressing the internal spring element.

16. The method according to claim 14, wherein:
said switching the biasing means of each socket to the passive condition comprises moving magnetic means, coupled with the thermal conditioning element of each socket, close to a magnetic driving structure to cause the magnetic means to move the thermal conditioning element away from the main surface of the electronic device by magnetic interaction with the magnetic driving structure, and
said switching the biasing means of each socket to the active condition comprises moving the magnetic means away from the magnetic driving structure thereby reducing the corresponding magnetic interaction.

17. The method according to claim 16, wherein:
said switching the biasing means of each socket to the passive condition comprises moving at least one permanent magnet of the magnetic means close to a ferromagnetic structure of the magnetic driving structure, and
said switching the biasing means of each socket to the active condition comprises moving said at least one permanent magnet away from the ferromagnetic structure.

18. The method according to claim 13, wherein:
said switching the biasing means of each socket to the active condition comprises testing the electronic devices at a test temperature thereby causing at least one shape memory element of at least one of one or more springs of the resilient means of each socket to take a first shape, and said switching the biasing means of each socket to the passive condition comprises inserting each electronic device into the corresponding socket and removing each electronic device from the corresponding socket at an assembly temperature thereby causing said at least one shape memory element to take a second shape, the assembly temperature being different from the test temperature.

19. The method according to claim 18, wherein:

said switching the biasing means of each socket to the active condition comprises heating said at least one shape memory element to the test temperature, and said switching the biasing means of each socket to the passive condition comprises cooling said at least one shape memory element to the assembly temperature lower than the test temperature.

20. The method according to claim 19, wherein said switching the biasing means of each socket to the active condition and said switching the biasing means of each socket to the passive condition comprise:

causing said at least one shape memory element to cross a transition temperature of each shape memory element between the first shape and the second shape comprised between 50-100° C.

\* \* \* \* \*